(12) United States Patent
Moussavi (10) Patent No.: US 6,583,743 B2
(45) Date of Patent: Jun. 24, 2003

(54) DIFFERENTIAL BIPOLAR STRAY-INSENSITIVE PIPELINED DIGITAL-TO-ANALOG CONVERTER

(75) Inventor: Mohsen Moussavi, Ottawa (CA)

(73) Assignee: Catena Networks, Inc., Redwood Shores, CA (US)

( * ) Notice: Subject to any disclaimer, the term of this patent is extended or adjusted under 35 U.S.C. 154(b) by 0 days.

(21) Appl. No.: 10/006,926

(22) Filed: Dec. 4, 2001

(65) Prior Publication Data

US 2002/0121997 A1 Sep. 5, 2002

(30) Foreign Application Priority Data

Dec. 4, 2000 (CA) ............................................. 2327644

(51) Int. Cl.⁷ ............................................... H03M 1/66
(52) U.S. Cl. ....................................... 341/144; 341/143
(58) Field of Search ................................ 341/144, 143, 341/145, 172, 150

(56) References Cited

U.S. PATENT DOCUMENTS 4,713,650 A  12/1987 Temes et al.
5,729,232 A * 3/1998 Fujimori ..................... 341/172
6,163,288 A * 12/2000 Yoshizawa .................. 341/144

\* cited by examiner

Primary Examiner—Peguy JeanPierre
Assistant Examiner—Joseph J Lauture
(74) Attorney, Agent, or Firm—Townsend and Townsend and Crew LLP; Kenneth R. Allen (57) ABSTRACT

A pipelined digital-to-analog converter (DAC) converts a digital input to an analog output. The pipelined DAC has a plurality of stages. A first of the plurality of stages is coupled to an initialization capacitor and ground. Each of the remainder of the plurality of stages is coupled to a respective previous stage. Each of the plurality of stages includes a capacitor, a first switch and a second switch. The capacitor has first and second plates. The capacitor receives a charge at the first plate in accordance with an associated bit of the digital input. The first switch couples the first plate of the capacitor to ground when the capacitor is not receiving the charge. The second switch couples the second plate of the capacitor to ground when the capacitor is receiving the charge. Coupling the capacitor to ground reduces the effect of stray capacitance in the pipelined DAC, improving its performance.

10 Claims, 11 Drawing Sheets

FIG. 13

DIFFERENTIAL BIPOLAR STRAY-INSENSITIVE PIPELINED DIGITAL-TO-ANALOG CONVERTER

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

A digital-to-analog converter (DAC) is a device for generating an analog output (usually a voltage or current) that is a representation of a sequence of bits at its input. For example, an 8-bit DAC outputs a voltage or current that can have one of 256 different values. So if the output ranges from 0 to 10V, the DAC outputs a voltage corresponding to one of 256 voltage levels between 0 and 10V. A number of techniques are used to implement this conversion.

One such technique is known as an algorithmic DAC, which is based on a step-by-step method. Generally, a multi-bit word, or digital input, is processed one portion at a time. In each step, a partial result from the previous step is combined with a portion of the multi-bit input word and then passed on to the next step.

Figure 1:
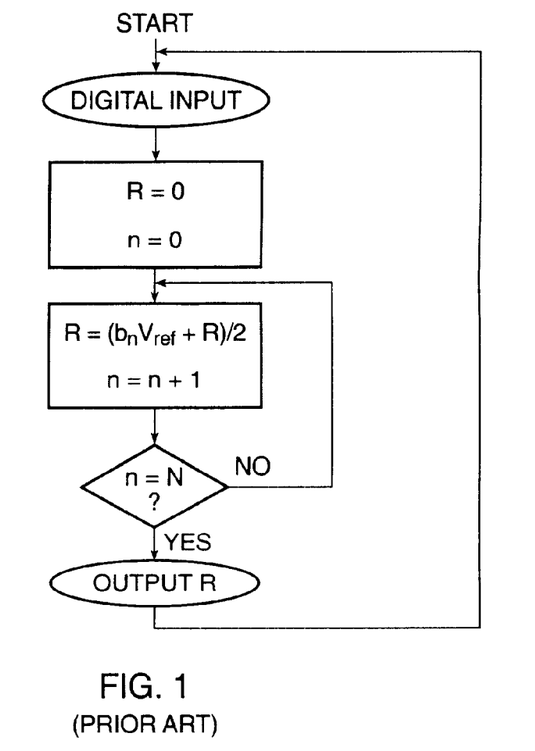
FIG. 1 is a flow diagram describing an algorithm for a digital to analog converter (prior art)

FIG. 1 is a flowchart illustrating the steps involved in the basic algorithmic DAC. The input word is processed one bit at a time, starting from the least significant bit. An interim value R is initialized to zero. A counter n, used to count the number of bits processed, is also initialized to zero. A loop commences wherein if a bit $b_n$ is 0, the interim value R is divided in half. If the bit $b_n$ is 1, the sum of the interim value R and a reference voltage $V_{ref}$ is divided in half. The value of the counter n is increased by one. The loop is repeated for the next-most significant bit until n=N, where N is the total number of bits in the word input. At that point, the interim value R represents an analog form of the word input. Dividing R in half weights the digital bits according to their significance. That is, the least significant bit has the smallest impact on the outcome of the DAC since it will be divided more times than any of the other bits.

Although there are other algorithms available in the art, the above technique is attractive because of the savings it offers in terms of circuit size and power. Two architectures that have been developed to implement this technique are the pipelined DAC and the cyclic DAC. The pipelined DAC provides operating speed at the expense of size and, therefore, power. The cyclic DAC is more economical than the pipelined DAC since it reuses the same hardware for each iteration of the algorithm. However, the reduction in size of the cyclic DAC comes at the expense of a lower output rate. It is most suitable to implement algorithmic DACs using a switched-capacitor (SC) technique; however, other techniques such as switched-current (SI) can also be used.

Figure 2A:
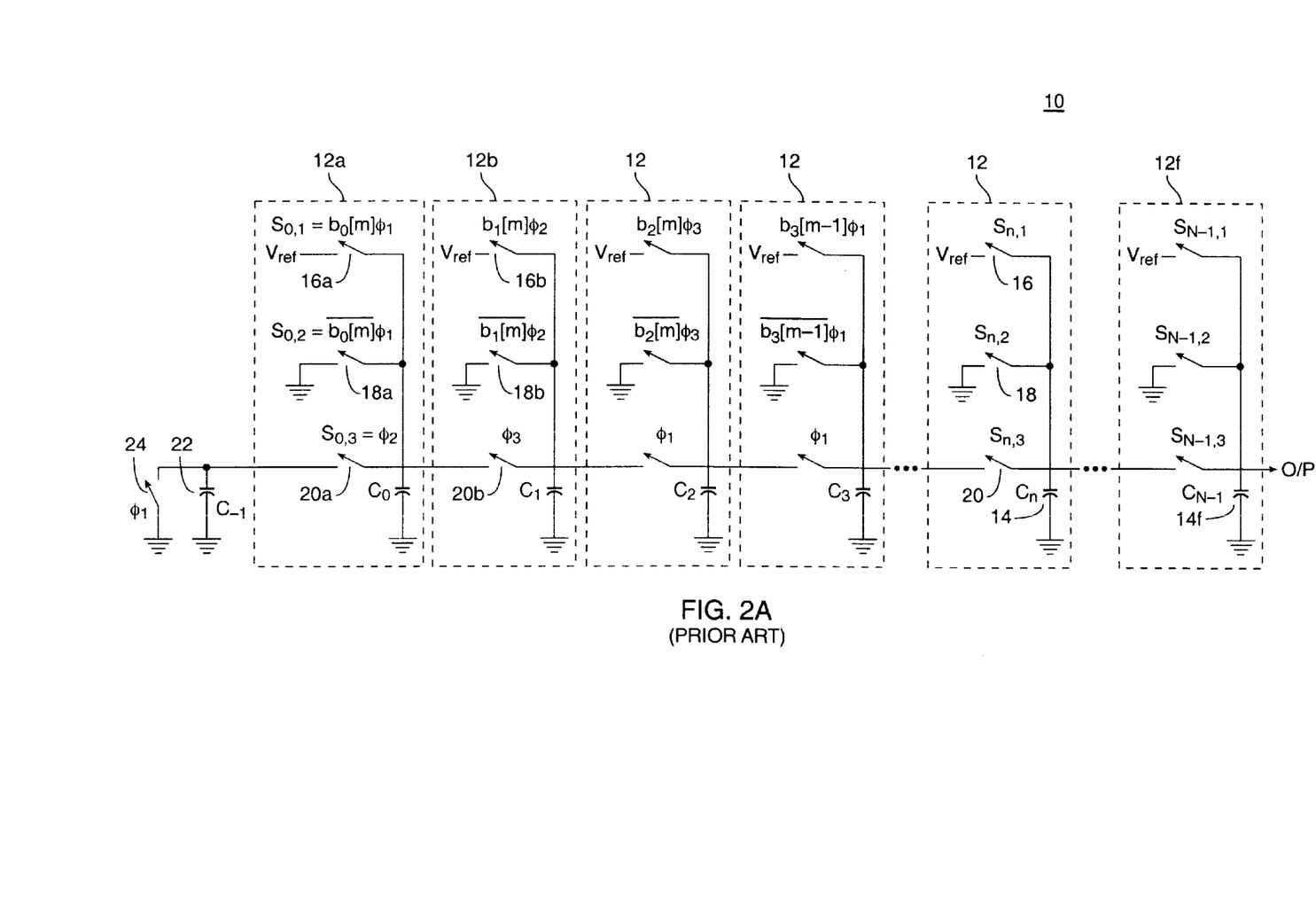
FIG. 2A is a schematic diagram of a quasi-passive pipelined digital to analog converter (DAC) (prior art)

FIG. 2A illustrates a SC quasi-passive pipelined DAC (QPPDAC), represented generally by the numeral 10 that is described below. (Originally, SC pipelined DACs used an operational amplifier (op amp) in each stage for performing the required operations; however, this made the DAC very expensive.) The DAC is referred to as quasi-passive because no op amps are used for performing the required operations. Rather, the DAC essentially comprises capacitors and switches.

The QPPDAC circuit 10 includes a series of stages 12. Each stage 12 comprises a capacitor 14 and several switches. A first plate (herein referred to as the bottom plate for illustrative purposes only) of the capacitor 14 is coupled to ground. A second plate (herein referred to as the top plate for illustrative purposes only) of the capacitor 14 is coupled to a reference voltage $V_{ref}$ via a first switch 16 and to ground via a second switch 18. The top plate of the capacitor 14 is also coupled to the top plate of the capacitor in a previous stage via a third switch 20. For the first stage 12a, there is no previous stage for the top plate of the capacitor 14 to be coupled. Instead, the top plate of the capacitor 14 is coupled via the third switch 20 to the top plate of an initialization capacitor 22, and an initialization switch 24. The initialization capacitor 22 has the same capacitance as the remaining capacitors 14. Both the bottom plate of the initialization capacitor 22 and the other end of the initialization switch 24 are coupled to ground. For the final stage 12f, the capacitor 14f is further coupled to an output stage such as sample and hold (not shown).

Figure 2B:
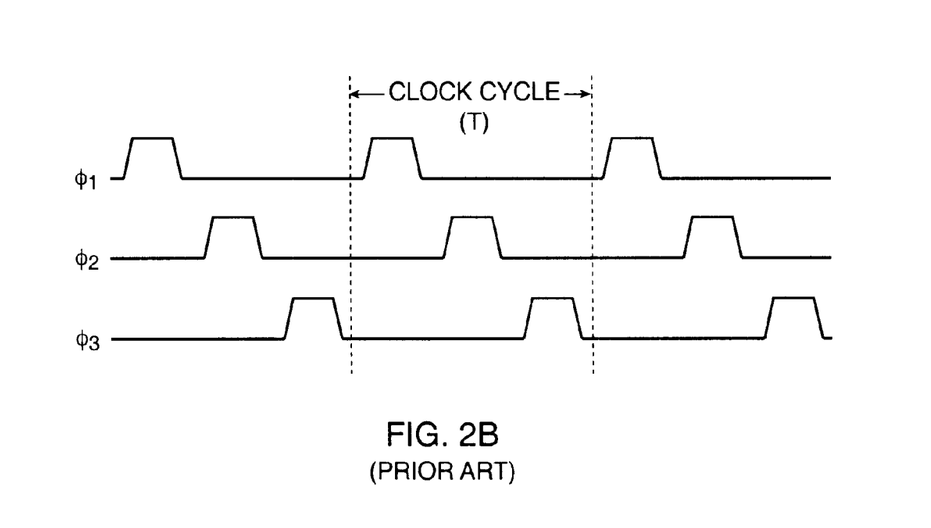
FIG. 2B is a timing diagram for a clock to be used in the DAC shown in FIG. 2A (prior art)

FIG. 2B shows a timing diagram for the QPPDAC. The QPPDAC uses a three-phase clock for timing. The clock phases run continuously; that is, no reset cycle or the like is necessary, and a portion of a new digital input word is taken in every clock cycle. Also, the phases are staggered in time and do not overlap. Therefore, the DAC can operate on (N div 3) words at the same time, where N is the number of resolution bits of the DAC and the portion of the word taken in is three (3) bits in size.

Figure 3:
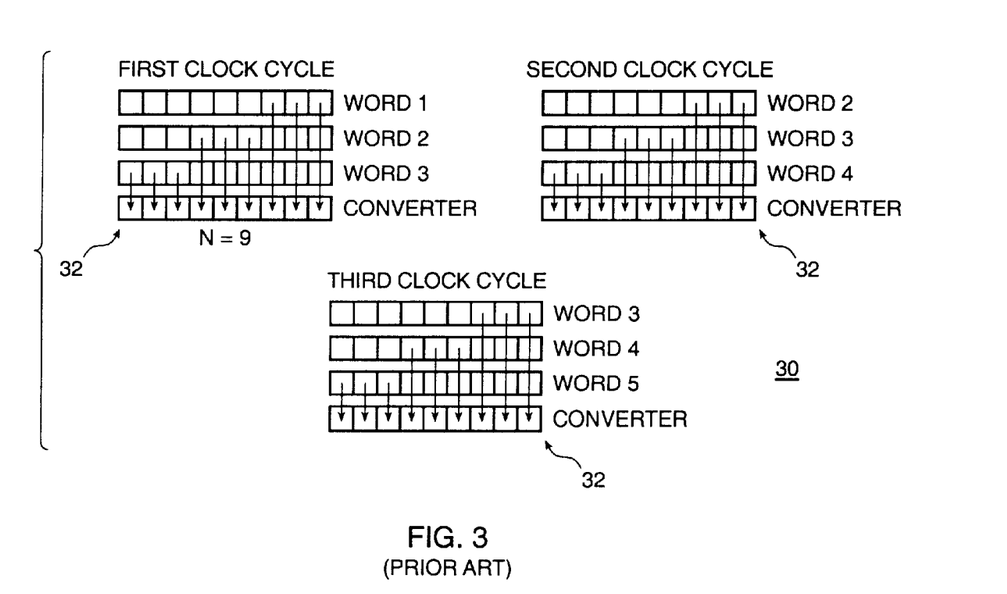
FIG. 3 is a block diagram illustrating the flow of input into the DAC shown in FIG. 2A (prior art)

FIG. 3 provides an illustrative example as to how the bits are input into the QPPDAC, represented generally by the numeral 30. In this example, N=9, so three numbers can be converted at a time. In a first clock cycle, three bits from each of three words are input to the DAC 32. These bits are the least significant bits (LSB) of word 3, the middle 3 bits of word 2, and the most significant bits (MSB) of word 1. The less significant bits of word 1 and word 2 have already been converted in previous clock cycles. In the next clock cycle, the middle three bits of word 3, the MSB of word 2, and the LSB of a new word, word 4, are converted. Lastly, in the next clock cycle, the MSB of word 3, the middle three bits of word four, and the LSB of a new word, word 5, are converted. Therefore, after 3 clock cycles, an entire 9-bit word is converted.

Referring once again to FIG. 2A, $b_j[k]$ represents the j-th bit of the k-th digital input word. The conversion process for each word begins with the LSB. Depending on the bit value, either the first switch 16a ($S_{0,1}$) or the second switch 18a ($S_{0,2}$) is closed during the first phase of the clock cycle, $\phi_1$. If the first switch 16a is closed, $C_0$ is charged to $V_{ref}$. If the second switch 18a is closed, $C_0$ is grounded. Therefore, the voltage at $C_0$ can be represented as $b_0[m]V_{ref}$, where $b_0$ is 1 or 0. At the same time, the initialization switch 24 is closed and the initialization capacitor 22 is discharged to ground. The third switch 20a remains open and closes only in the following clock phase.

In the second phase, $\phi_2$, of the same clock cycle, the first switch 16a and second switch 18a in the first stage 12a are opened and the third switch 20a closes. $C_0$ shares its charge with the initialization capacitor 22 through the third switch 20a. Since all the capacitors are matched, the voltage at $C_0$ is equal to:

$$V_{C_0} = (b_0[m]V_{ref})/2$$

During the same phase of the same clock cycle $\phi_2$, $C_1$ is charged to $b_1[m]V_{ref}$, where $b_1$ is 1 or 0.

In the third phase, $\phi_3$, of the same clock cycle, the third switch 20a in the first stage 12a opens. Also, the first switch 16b and the second switch 18b in the second stage 12b are opened and the third switch 20b closes. Therefore, the voltage across $C_1$ and $C_0$ is shared. Again, since the capacitors are matched, the voltage will divide equally across $C_1$ and $C_0$. Therefore, at the end of the third phase of the clock cycle, $\phi_3$, the voltage across $C_1$ is:

$$V_{C_1} = \frac{1}{2}b_1[m]V_{ref} + \frac{1}{4}b_0[m]V_{ref}$$

At the same time, that is during $\phi_3$ of the same clock cycle, $C_2$ is charged to $b_2[m]V_{ref}$, where $b_2$ is 0 or 1.

The next phase is the first phase, $\phi_1$, of the next clock cycle. The first three stages behave as described above. The fourth stage 12d continues to convert the same word. The third switch 20b in the second stage 12b opens. Also, the first 16c and second 18c switches in the third stage 12c are opened and the third switch 20c closes. Therefore, the voltage across $C_2$ and $C_1$ is shared. Again, since the capacitors are matched, the voltage will divide equally across $C_2$ and $C_1$. Therefore, at the end of the first phase, $\phi_1$, of the next clock cycle, the voltage across $C_2$ is:

$$V_{C_2} = \frac{1}{2}b_2[m]V_{ref} + \frac{1}{4}b_1[m]V_{ref} + \frac{1}{8}b_0[m]V_{ref}$$

At the same time, that is during $\phi_1$ of the same clock cycle, $C_3$ is charged to $b_3[m]V_{ref}$ where $b_3$ is 0 or 1.

The digital input bits are properly delayed for ensuring that they are processed at the correct time. The DAC continues in a similar fashion until a charge is accumulated on the capacitor 14 in the last stage. At this point the accumulated charge is an analog representation of the digital word input. Due to the pipelined architecture of the system, the throughput of the DAC is one word per clock cycle.

However, this architecture for a QPPDAC suffers from parasitic capacitance. The parasitic capacitance is due to several factors, including the reverse biased junction capacitance of the switches and any stray metal-to-metal or metal-to-substrate capacitance that could have been introduced in the manufacturing process. This parasitic, or stray, capacitance brings stray charge into the conversion operation.

The stray charge in the system is undesirable for two reasons. The first reason is that the stray charge can lead to a gain error. Since the voltage on a capacitor is proportional to the charge on the capacitor, any stray charge will affect voltage and will lead to inaccurate results. The second undesirable affect of the stray capacitance is that it is typically non-linear. Non-linearity of the capacitors makes the output voltage a non-linear function of the input, again distorting the results. The problem of non-linearity is more serious for high-speed DACs, where large switches (with large junction capacitance) are used for shorter charge and discharge times.

Figure 4:
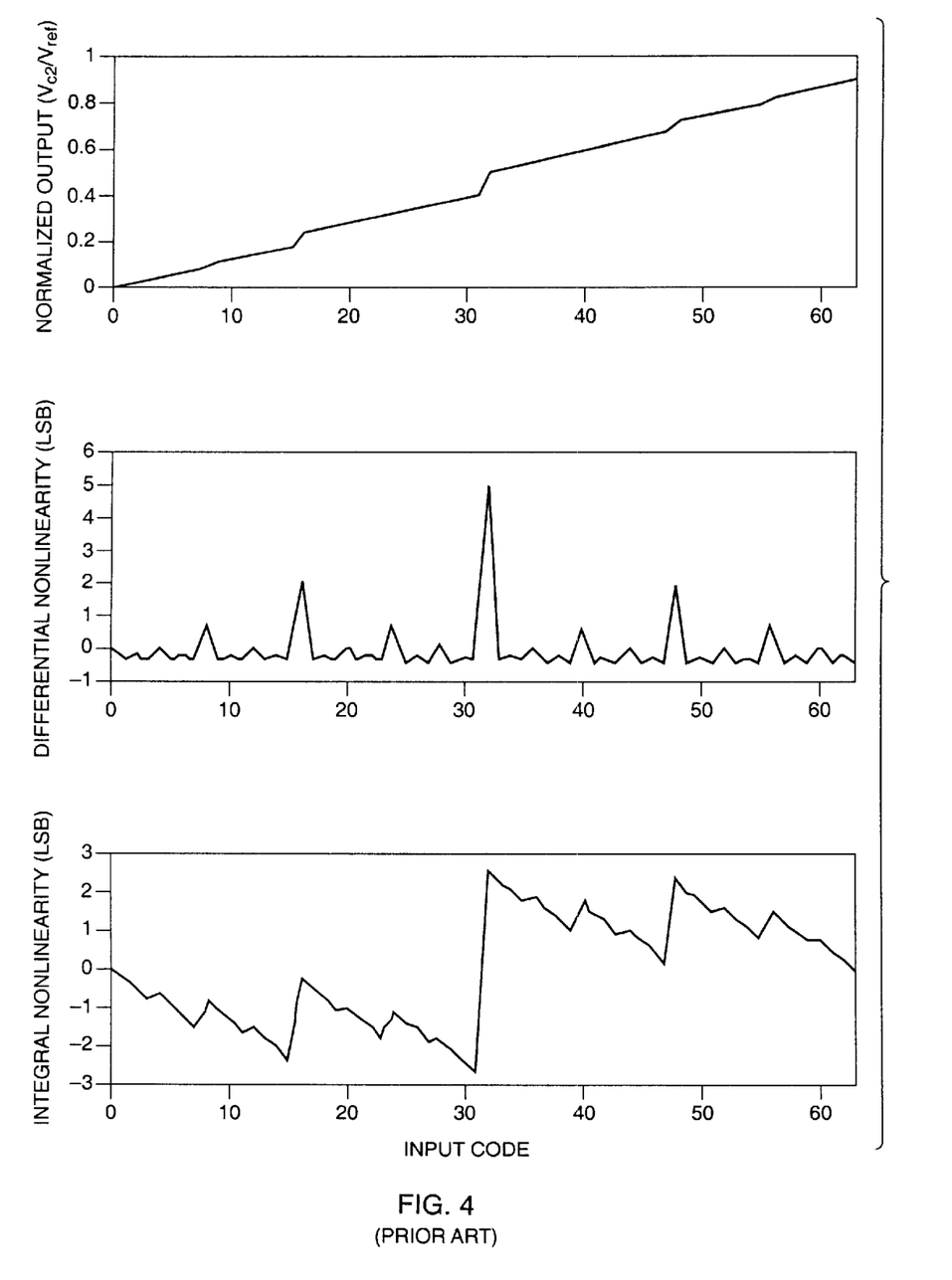
FIG. 4 is a graph illustrating the position of the largest differential non-linearity of the DAC shown in FIG. 2A (prior art)

Another shortcoming of the QPPDAC is that its largest differential non-linearity (DNL) is at the midrange. FIG. 4 illustrates this problem. This large DNL is caused by capacitor mismatch, which is inevitable in the manufacturing process. In general, a mismatch between any of the equivalent capacitors creates conversion non-linearity.

It is an object of the present invention to obviate or mitigate at least some of the disadvantages mentioned above.

BRIEF SUMMARY OF THE INVENTION

In accordance with an aspect of the present invention, there is provided a pipelined digital-to-analog converter (DAC) for converting a digital input to an analog output. The pipelined DAC has a plurality of stages. A first of the plurality of stages is coupled to an initialization capacitor and ground. A remainder of the plurality of stages is coupled to a previous stage. Each of said plurality of stages includes a capacitor, a first switch and a second switch. The capacitor has a first and second plate and receives a charge at the first plate in accordance with an associated bit of the digital input. The first switch couples the first plate of the capacitor to ground when the capacitor is not receiving the charge. The second switch couples the second plate of the capacitor to ground when the capacitor is receiving the charge. Coupling the capacitor to ground reduces the effect of stray capacitance in the pipelined DAC.

In accordance with a further aspect of the invention, there is provided a DAC for converting a digital input to an analog output. The DAC includes a first DAC circuit, a second DAC circuit, and a combiner. The first DAC circuit is coupled to the digital input and a sign of the digital input. A reference voltage to the first DAC circuit is positive if the digital input is positive and negative if the digital input is negative. The second DAC circuit is coupled to the digital input and an inverse of the sign of the digital input. A reference voltage to the second DAC circuit is positive if the digital input is negative and negative if the digital input is positive. A combiner subtracts the output of said second DAC from the output of the first DAC.

In accordance with yet another aspect of the invention, there is provided a DAC for converting a digital input to an analog output. The DAC is coupled to a positive reference voltage if the digital input is positive and a negative reference voltage if the digital input is negative, thereby doubling the DAC's output range and moving a large differential non-linearity from a midpoint of the output range.

BRIEF DESCRIPTION OF THE DRAWINGS

The present invention will now be described by way of example only with reference to the following drawings in which.

DETAILED DESCRIPTION OF THE INVENTION

For convenience, like numerals in the description refer to like structures in the drawings.

Figure 5A:
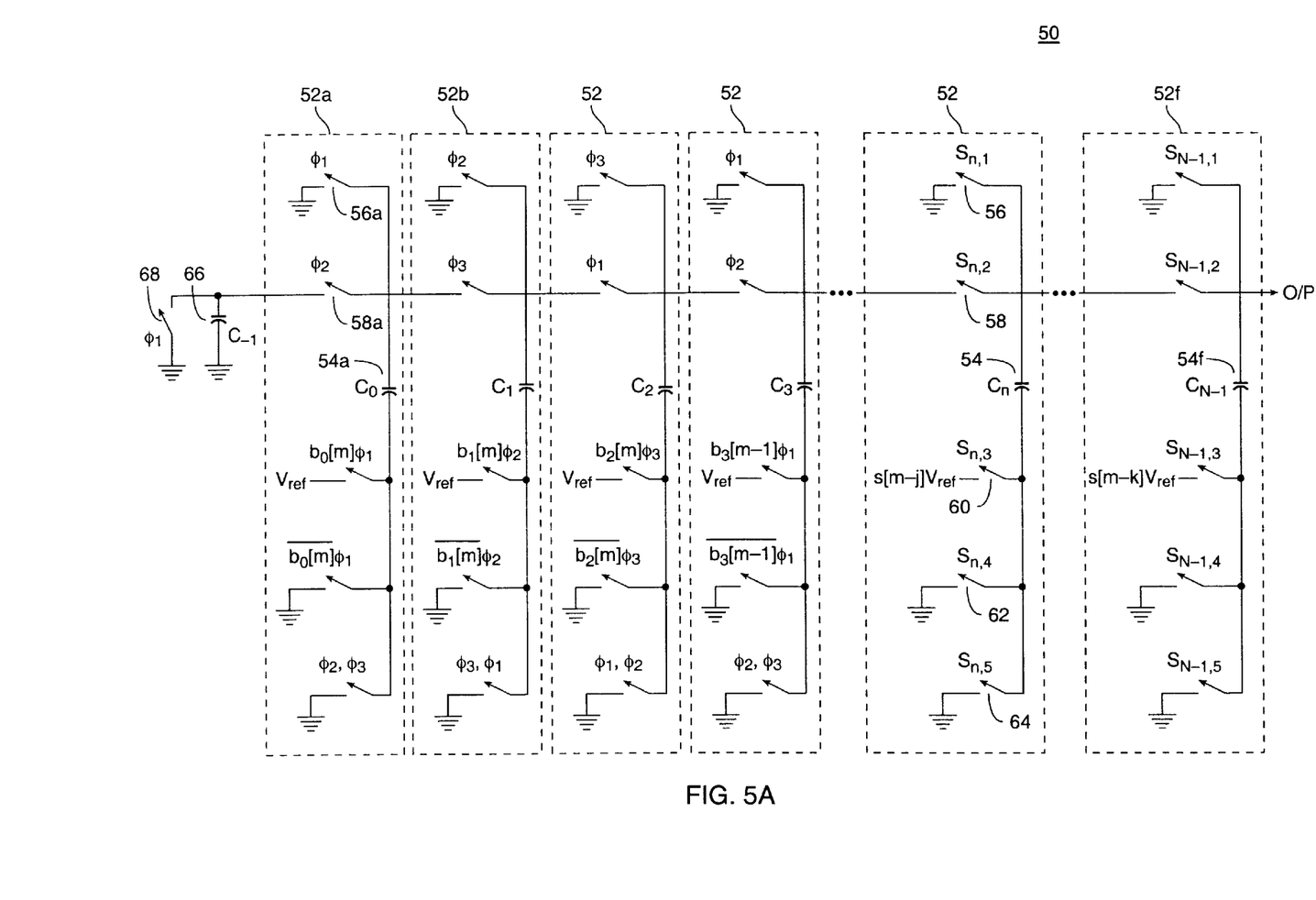
FIGS. 5A–5C are respectively a schematic diagram, a timing diagram, and a schematic diagram of a quasi-passive pipelined DAC in accordance with an embodiment of the invention.

Referring to FIG. 5A, a QPPDAC circuit is represented generally by the numeral 50. The circuit 50 behaves in a similar fashion to the circuit 20 illustrated in FIG. 2A; however, it is arranged for minimizing the effects of stray capacitance. The circuit 50 includes several stages 52. Each stage comprises a capacitor 54 and several switches. A top plate of the capacitor 54 is coupled to ground via a first switch 56. The top plate of the capacitor is further coupled to the previous stage via a second switch 58. A bottom plate of the capacitor 54 is coupled to the reference voltage $V_{ref}$ via a third switch 60 and coupled to ground via a fourth switch 62. The bottom plate is further coupled to ground via a fifth switch 64.

Figure 5B:
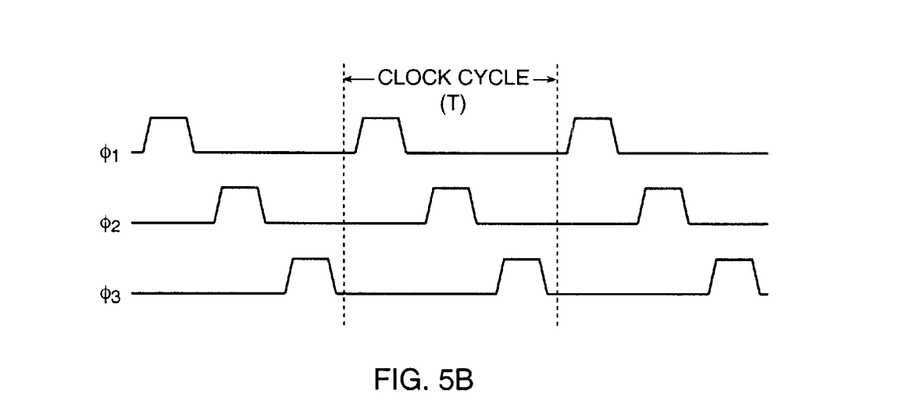

For the first stage 52a, there is no previous stage for the top plate of the capacitor 54a to be coupled. Rather, the top plate of the capacitor 54a is coupled via the second switch 58a to the top plate of an initialization capacitor 66 and to an initialization switch 68. The initialization capacitor 66 has the same capacitance as the other capacitors 54. Both the bottom plate of the initialization capacitor 66 and the other end of the initialization switch 68 are coupled to ground. For the final stage 52f, the capacitor 54f is further coupled to an output stage such as sample and hold (not shown). Referring to FIG. 5B, a three-phase clock is implemented for the timing of the circuit 50, as in the prior art.

Implementing the QPPDAC in the above manner removes a majority of the effect of stray capacitance. For example, charging the capacitor 54a in the first stage 52a to $V_{ref}$ (assuming bit $b_0[m]$ is a 1) is described as follows.

Figure 5C:
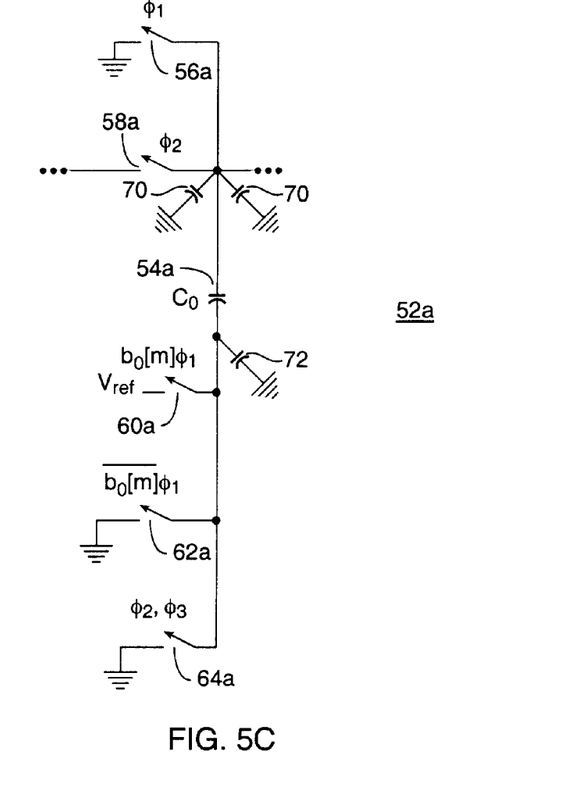

FIG. 5C shows an exploded view of the first stage 52a of the circuit 50. The figure includes schematic representations of the parasitic (stray) capacitance. The capacitor 54a is charged during the first phase, $\phi_1$, of each clock cycle. Therefore, the first switch 56a is closed and the top plate of the capacitor 54a is grounded. The stray capacitance 70 associated with the top plate of the capacitor 54a is effectively removed since both "plates" of the parasitic capacitance 70 are coupled to ground.

While the top plate is grounded, the bottom plate is charged with a charge equal to:

$$q = C_0 V_{ref}$$

When the clock enters the second phase $\phi_2$, the first switch 56a is opened, as is the switch 60a providing the reference voltage. During $\phi_2$, the bottom plate is grounded via the switch 64a. The parasitic capacitance 72 associated with the bottom plate of the capacitor 54a is, therefore, effectively removed since both "plates" of the parasitic capacitance are coupled to ground. Since the charge on the capacitor 54a remains the same, so must the voltage across it. Therefore, when the bottom plate is grounded, the voltage is transferred to the top plate. The switch 58a connecting the first stage 52a to the initialization capacitor 66 is closed and the voltage across the capacitor 54a is shared. The circuit continues to work in the same manner as described in the prior art using the architecture described in the present embodiment of the invention until the charge on the final capacitor represents an analog conversion of a digital input.

There is still, however, an issue with non-linearity. Although the gain error is improved by grounding the top plate while the capacitors are charging, there is still a non-linearity introduced by the switches that cannot be avoided. The non-linearity, however, can be removed after the last stage 54f of the DAC, as described below.

Figure 6:
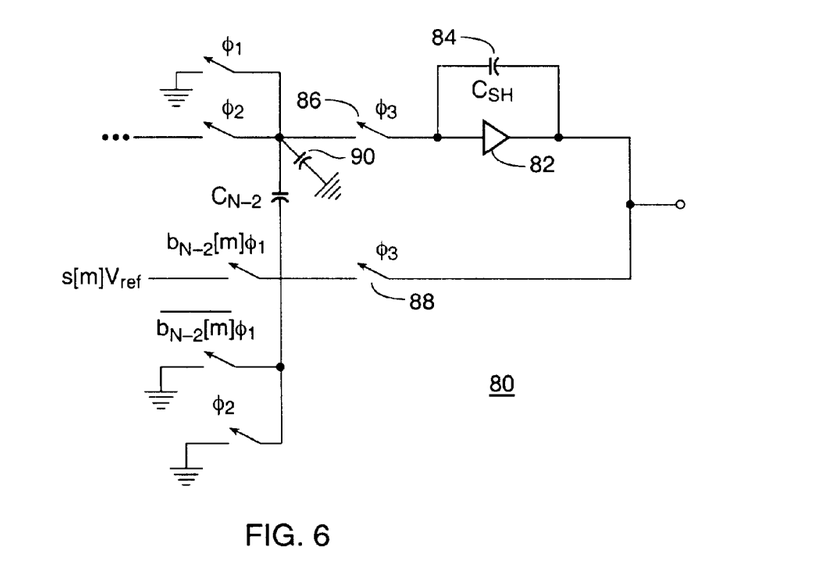
FIG. 6 is a schematic diagram of a first stage of a sample and hold circuit.

Referring to FIG. 6, a first stage of a sample and hold (SH) circuit is illustrated generally by numeral 80. The first stage of the SH circuit 80 comprises an inverting amplifier 82, a linear SH capacitor 84, a first SH switch 86 and a second SH switch 88. The SH capacitor 84 is coupled to the amplifier in a negative feedback configuration. The first SH switch 86 couples the input of the amplifier 82 to the top plate of the capacitor 54f in the last stage 52f of the DAC. The second SH switch 88 couples the output of the amplifier 82 to the bottom plate of the capacitor 54f in the last stage 52f of the DAC. Non-linear capacitance associated with the system is represented graphically as a capacitor 90.

In the embodiment illustrated in FIG. 6, the resolution of the DAC modulus the number of bits input at a time is equal to one. Therefore, the capacitor 54f in last stage 52f of the DAC is charged during the first phase $\phi_1$ of the clock cycle. Similarly, if the resolution of the DAC modulus the number of bits input at a time was equal to two, the capacitor in the last stage of the DAC would be charged during the second phase $\phi_2$ of the clock cycle. Since the number of bits input at a time is equal to three for the present embodiment, the last alternative occurs when the resolution of the DAC modulus the number of bits input at a time is equal to 0. In this case, the capacitor in the last stage of the DAC would be charged during the third phase $\phi_3$ of the clock cycle.

For any of the above described cases, the SH switches 86 and 88 both close two phases after the capacitor is charged. In the embodiment illustrated in FIG. 6, the SH switches 86 and 88 close during the third phase, $\phi_3$. This allows the capacitor to charge to the value of the n-th bit during the first phase, and allows the previous n−1 bits to be added to the n-th bit in the second phase. During the third phase $\phi_3$, the SH switches 86 and 88 are closed. The input to the amplifier 82 is at analog ground and therefore forces the top plate of the capacitor 54f in the last stage 52f to ground. Therefore, the non-linear capacitance 90 is effectively removed, since both the top "plate" and the bottom "plate" are grounded. Since all of the other switches are open, the charge associated with the capacitor 54f on the final stage is shared with the SH capacitor 84. If the capacitors 54f and 84 are matched and there is no charge already on the SH capacitor 84, then they will share the charge equally. Since both capacitors are linear, the output of the DAC will be linear.

Figure 10A:
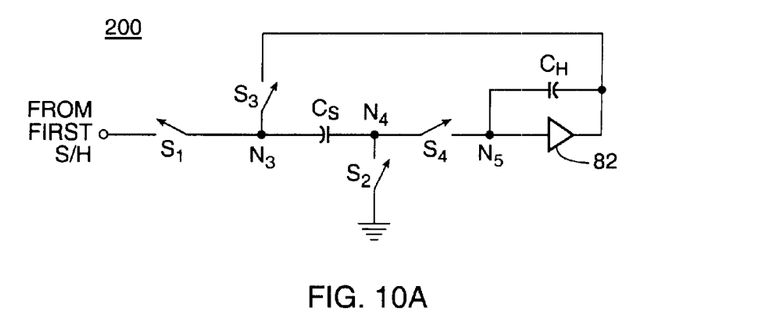
FIG. 10A is a schematic diagram of a second stage of a sample and hold circuit.

Referring to FIG. 10A, a second stage of the sample and hold (SH) circuit is illustrated generally by numeral 200. The second stage of the SH circuit 200 comprises an amplifier 82, a sample capacitor $C_S$, a hold capacitor $C_H$, and four SH switches $S_1$, $S_2$, $S_3$, and $S_4$. One end of sample capacitor $C_S$ is coupled the output of the first stage SH circuit 80 via the first switch $S_1$ and to the output of the amplifier via the third switch $S_3$. The other end of the sample capacitor $C_S$ is coupled to the input of the amplifier 82 via the fourth switch $S_4$ and to ground via the second switch $S_2$. The hold capacitor $C_H$ is coupled to the amplifier 82 in a negative feedback configuration.

Figure 10B:
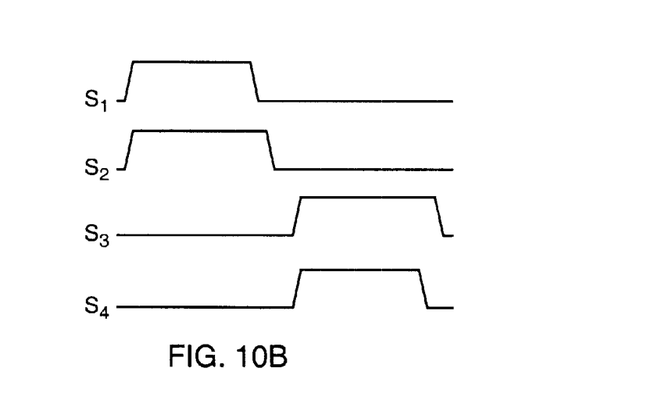
FIG. 10B is a timing diagram for a clock to be used in the SH circuit shown in FIG. 10A.

Referring to FIG. 10B, the timing for the switches in FIG. 10A is illustrated. The first and second switches $S_1$ and $S_2$ are closed first, simultaneously. This charges the sample capacitor $C_S$ to the input voltage. The first and second switches $S_1$ and $S_2$ are then opened and the third and fourth switches $S_3$ and $S_4$ are closed. This transfers the input voltage to the hold capacitor $C_H$. The second stage of the SH circuit 200 provides continuous time linearity, that is, linearity during transients. While a specific SH circuit is described above, the DAC may be implemented using other SH circuits that are either proprietary or known in the art.

The DAC, however, still has its largest differential non-linearity (DNL) at the middle of its range. The DNL can be reduced and moved away from that point by a technique referred to as bipolar conversion.

Figure 7:
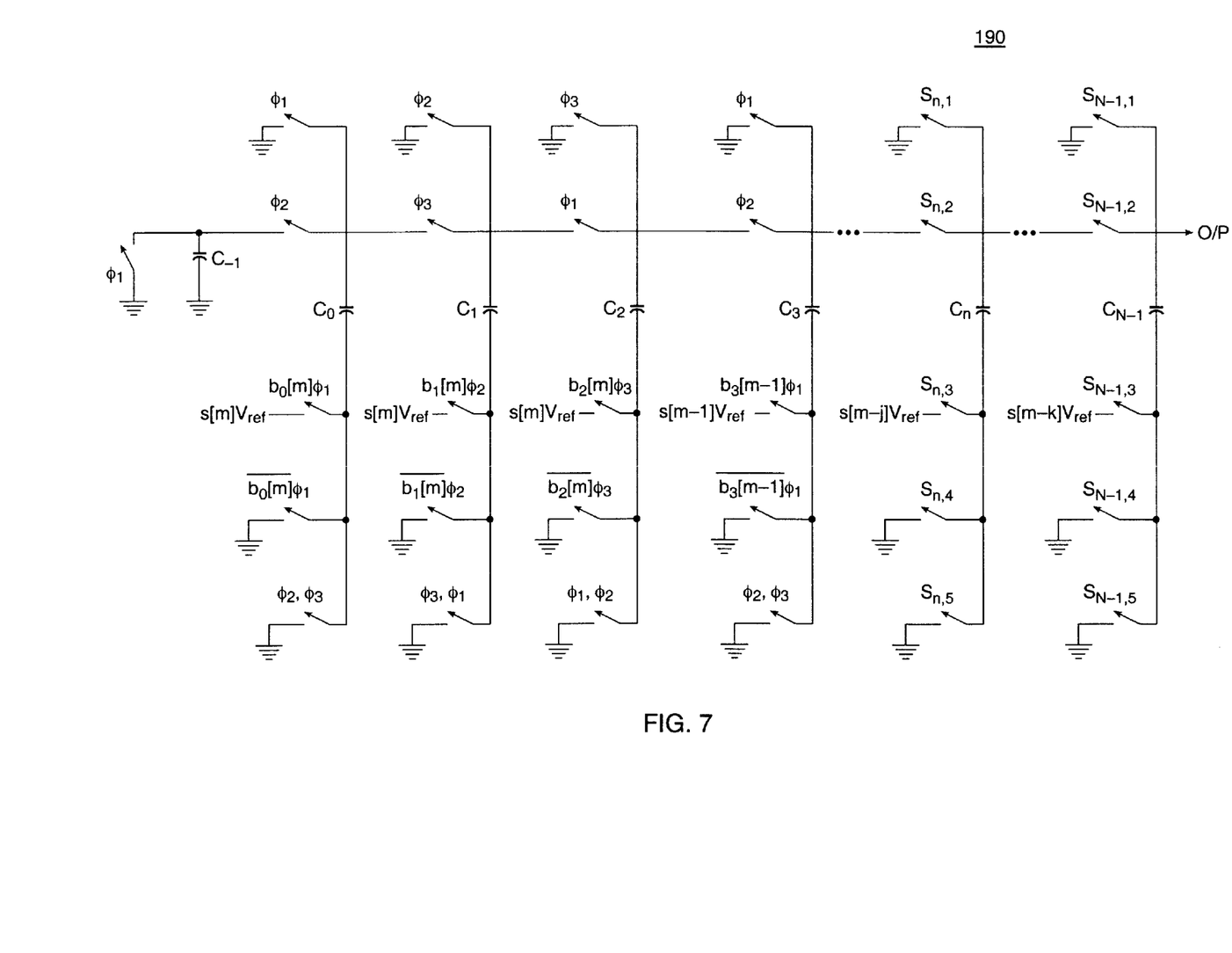
FIG. 7 is a schematic diagram of a bipolar quasi-passive pipelined DAC.

FIG. 7 illustrates the DAC previously described, further amended for allowing bipolar conversion, represented generally by the numeral 190. This DAC circuit 190 behaves in a similar fashion as the previously described circuit illustrated in FIG. 5A. However, the reference voltage $V_{ref}$ that is applied depends on the sign of the input word that is being converted. If the input word is negative, then a negative voltage is applied. If the input word is positive, then a positive voltage is applied. In FIG. 7, the sign of the input is represented as s[m], where s[m]=±1. The sign of the input may be represented with a sign bit or in two's complement notation. There are several effective methods of converting between the two formats that are known to a person skilled in the art. The magnitude of the digital input determines the magnitude of the analog output. For unipolar conversion, the DAC ranges from 0 to a maximum in a positive direction on both axes. For bipolar conversion, the DAC ranges from a maximum in a negative direction to a maximum in the positive direction on both axes.

Figure 8:
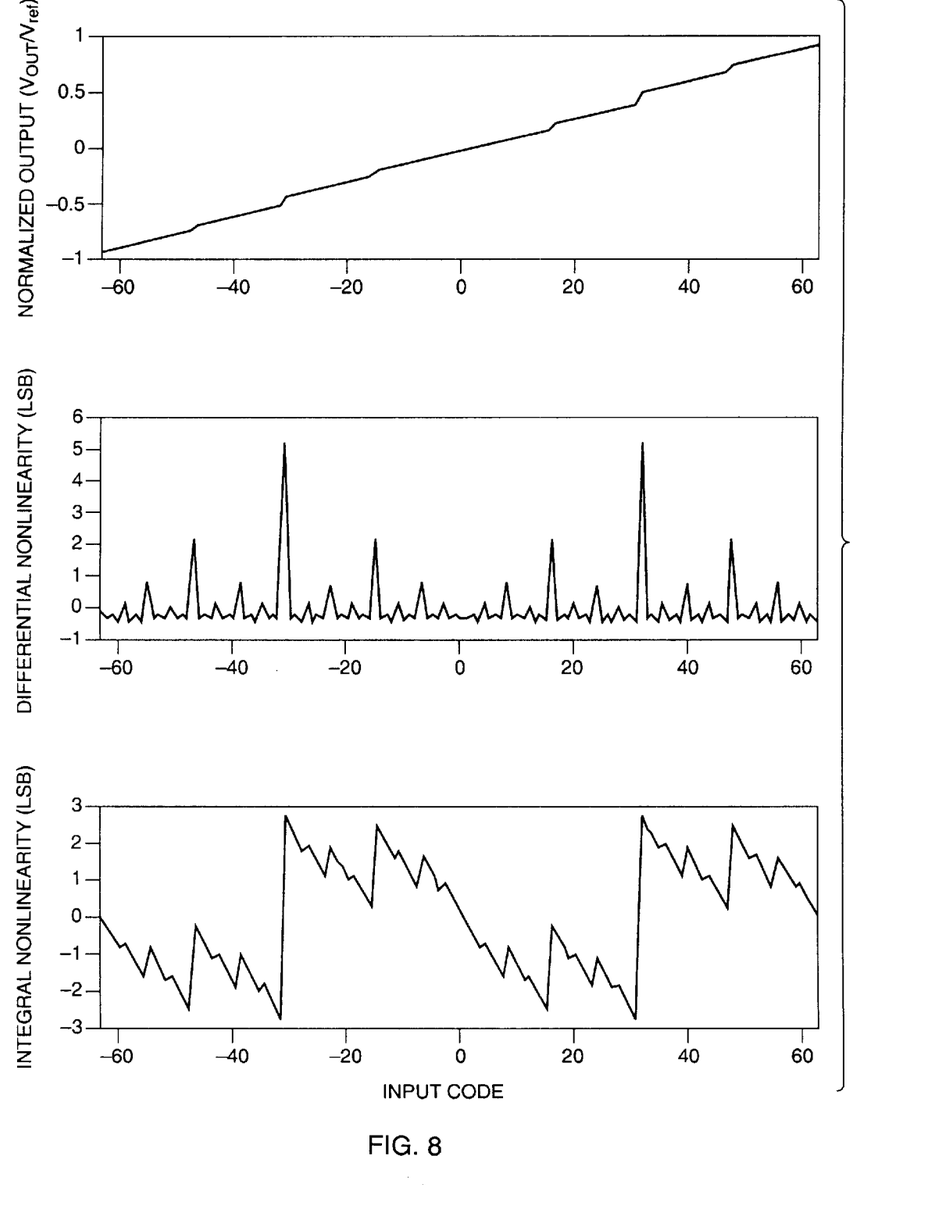
FIG. 8 is a graph illustrating the position of the largest differential non-linearity of the DAC shown in FIG. 7.

There are two advantages in using this architecture. First, the major DNL error is moved away from the midpoint to the ¼ and ¾ range points. Secondly, since the output range is effectively doubled, the non-linearity loses its significance by one bit. These facts are better illustrated in the linearity plots shown in FIG. 8. While the discontinuities have maintained their sizes, one extra bit of resolution is obtained due to the doubled output range. The fact that the converter is most linear at the midpoint makes the dynamic range of the DAC virtually independent of its linearity. This is a significant advantage for this DAC in many practical applications such as audio and voice.

However, there is a difficulty with the implementation of a bipolar DAC. A mismatch between the positive and negative voltages can cause significant non-linearity.

Figure 9:
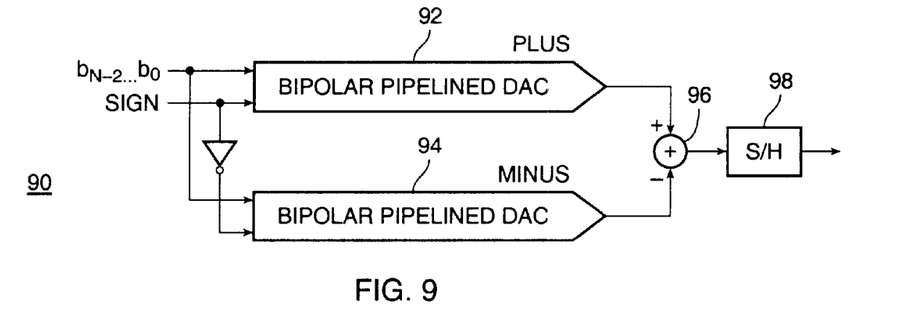
FIG. 9 is a schematic diagram of a differential bipolar quasi-passive pipelined DAC.

FIG. 9 illustrates a differential architecture, represented generally by the numeral 90, that is used for avoiding this issue as well as improving the noise immunity of a DAC in a system. The differential architecture 90 includes a positive bipolar pipelined DAC circuit 92, a negative bipolar pipelined DAC circuit 94, a combiner 96, and a sample and hold circuit 98. Each DAC circuit 92 and 94 has a first input, a second input, and an output. The output of each DAC circuit 92 and 94 is connected to the combiner 96. The combiner 96 is connected to the sample and hold circuit 98.

The first input for each DAC is used for receiving the digital input and the second input for each DAC is used for the sign of the digital input. The negative DAC circuit 94 is virtually a mirror image of the positive DAC circuit 92. While they share the same digital input, they use opposite reference voltages. A signal to be input to the sample and hold circuit 98 is obtained by subtracting the output of the negative DAC circuit 94 from the output of the positive DAC circuit 92 in the combiner 96. The sample and hold circuit is preferably a differential circuit itself.

The differential DAC can therefore virtually cancel the reference voltage mismatch by averaging them out. Although this is clear intuitively, a mathematical derivation helps to quantify it. Let the inherent gain of the plus 92 and minus 94 sides be $G_p$ and $G_m$ respectively. Ideally, $G_p=G_m=1$, but due to capacitor mismatches these gains may have slight errors. The actual gain (slope) of the plus side 92 and the minus side 94 for a digital input with a positive sign is then $G_p V_{ref+}$ and $G_m V_{ref-}$ respectively. The overall slope of the converter, after sample and hold 98, for positive digital inputs can be written as:

$$S_p = G_p V_{ref+} - G_m V_{ref-}$$

Similarly, the negative slope is:

$$S_n = G_p V_{ref-} - G_m V_{ref+}$$

Ideally, $S_p = -S_n$, and no distortion is caused by slope mismatch. The exact slope mismatch is:

$$\Delta S = S_p + S_n = (G_p - G_m)(V_{ref+} + V_{ref-})$$

This mismatch is less than the single-ended mismatch of $V_{ref+} + V_{ref-}$ by a factor of $G_p - G_m$.

Another advantage of the differential architecture for the DAC is the reduction of capacitor non-linearity error. Capacitor non-linearity can arise from penetrations of an electric field of the capacitor into the plates. This non-linearity affects the integral linearity of the converter.

Generally, the pipeline stages settle faster than the SH circuit. Therefore, to avoid the speed of the SH circuit becoming a bottleneck, an additional stage is added in parallel with the last stage.

Figure 11:
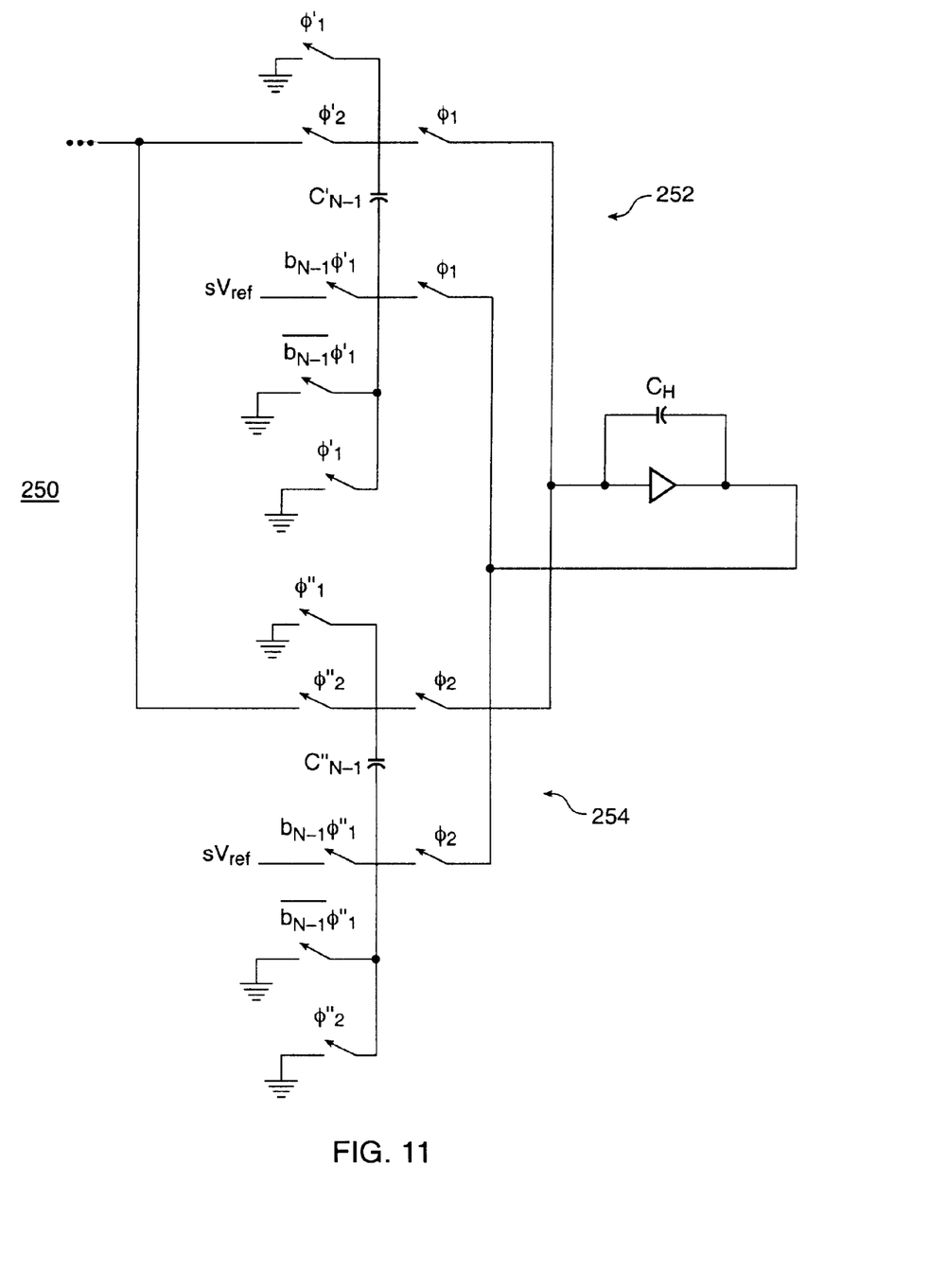
FIG. 11 is a schematic diagram of a pipelined DAC with a pair of parallel final stages.

Referring to FIG. 11, this embodiment of the invention is illustrated generally by numeral 250. The stages 252 and 254 are multiplexed between the DAC and the SH circuit. While one of the stages is participating in the digital to analog conversion, the other is transferring charge to the SH. This allows the SH circuit to operate as slow as half the speed of the DAC circuit without constraining the overall conversion speed.

Figure 12:
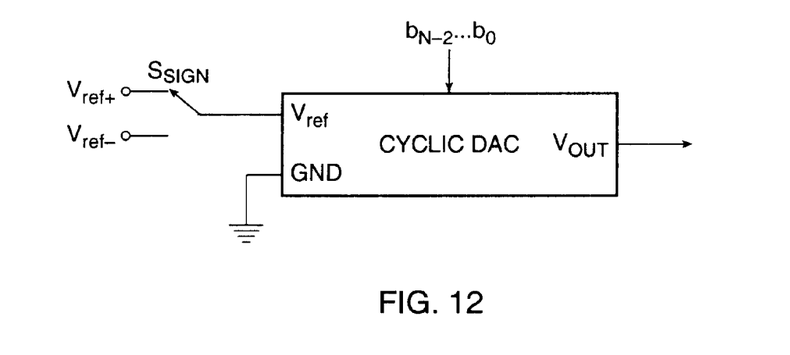
FIG. 12 is a schematic diagram of a cyclic DAC with a positive and a negative reference voltage.
Figure 13:
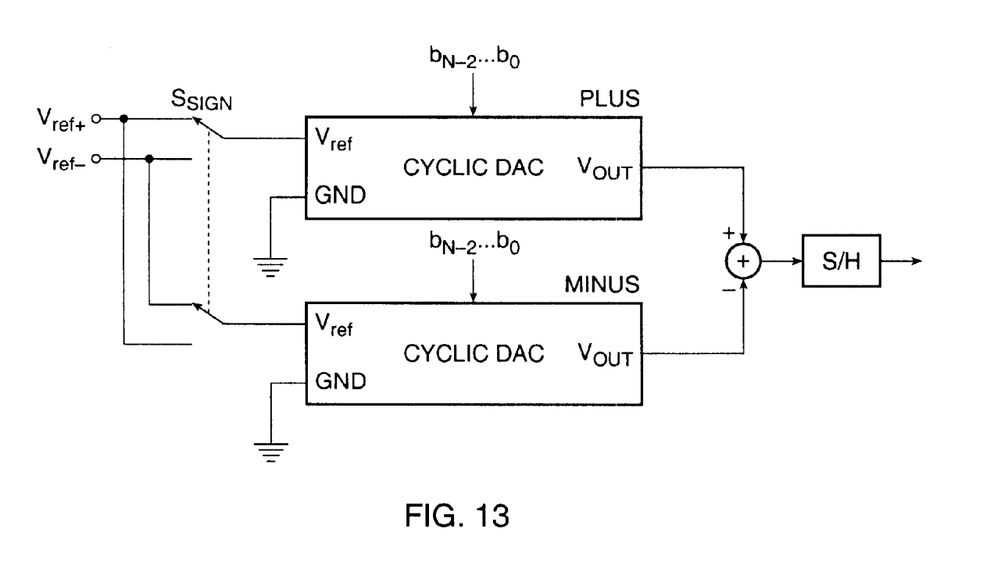
FIG. 13 is a schematic diagram of a differential bipolar cyclic DAC.

While the embodiments described above refer to the pipeline implementation of the DAC, the ideas can just as effectively be implemented for a cyclic DAC. Referring to FIG. 12, a cyclic DAC is provided with a positive and negative voltage, which has the same effects as described for the pipelined DAC. Further, referring to FIG. 13, a cyclic DAC with a positive reference voltage and a cyclic DAC with a negative reference voltage are coupled in parallel. Again, this has the same effects as described for the pipelined DAC.

While the pipelined DAC produces a new output on every clock cycle, the cyclic DAC requires a number of clock cycles for a conversion. The SH stage circuit of the cyclic DAC is approximately 3 times slower than the switch and capacitors in the transfer of change. Since the number of conversion bits is typically much larger than 3, the same SH stage circuit can be shared by multiple cyclic DAC circuits. Therefore, a bank of cyclic DACs may be implemented that delivers conversion rates between those of a single cyclic DAC and a pipelined DAC.

While the invention has been described in connection with a specific embodiment thereof and in a specific use, various modifications thereof will occur to those skilled in the art without departing from the spirit of the invention.

The terms and expressions which have been employed in the specification are used as terms of description and not of limitations, there is no intention in the use of such terms and expressions to exclude any equivalents of the features shown and described or portions thereof, but it is recognized that various modifications are possible within the scope of the invention. The present invention is intended to be defined according to the following claims and their equivalents.

What is claimed is:

1. A pipelined digital-to-analog converter (DAC) for converting a digital input to an analog output, said pipelined DAC comprising:
    a plurality of stages, a first of said plurality of stages being coupled to an initialization capacitor and ground, each of a remainder of said plurality of stages being respectively coupled to a previous stage, wherein each of said plurality of stages includes:
        a capacitor having a first plate and a second plate, said capacitor receiving a charge at said first plate in accordance with an associated bit of said digital input;
        a first switch that selectively couples said first plate of said capacitor to ground when said capacitor is not receiving said charge; and
        a second switch that selectively couples said second plate of said capacitor to ground when said capacitor is receiving said charge,
        wherein coupling said capacitor to ground reduces an effect of stray capacitance in said pipelined DAC.

2. The pipelined DAC of claim 1, wherein each of said remainder of said plurality of stages are respectively coupled to said previous stage by a third switch coupled between said second plate of said capacitor and a second plate of a corresponding capacitor in said previous stage.

3. The pipelined DAC of claim 1, wherein said first plate is coupled to a reference voltage if said associated bit of said digital input is equal to one and coupled to ground if said associated bit of said digital input is equal to zero.

4. The pipelined DAC of claim 3, wherein said reference voltage is positive if said digital input is positive and said reference voltage is negative if said digital input is negative.

5. The pipelined DAC of claim 1, further comprising a first sample and hold (SH) circuit, wherein said first SH circuit comprises:
    a first amplifier having an input and an output, wherein said input is coupled to said second plate of said capacitor in a last stage of said plurality of stages via a first SH switch, and wherein said output is coupled to said first plate of said capacitor in said last stage via a second SH switch; and
    a first SH capacitor coupled to said first amplifier in a negative feedback configuration,
    wherein said charge is transferred from said capacitor in said last stage to said first SH capacitor in a linear fashion for providing a linear output.

6. The pipelined DAC of claim 5, wherein said last stage comprises two parallel stages for reducing a bottleneck at said first SH circuit, said first SH circuit multiplexing between each of said two parallel stages.

7. The pipelined DAC of claim 5, further comprising a second SH circuit, wherein said second SH circuit comprises:
    a second SH capacitor having a first plate and a second plate, said first plate being coupled to an output from said first sample and hold circuit via a third SH switch and said second plate being coupled to ground via a fourth SH switch;
    a second amplifier having an input thereof coupled to said second plate of said second SH capacitor via a fifth SH switch and an output thereof coupled to said first plate of said second SH capacitor via a sixth SH switch; and
    a hold capacitor coupled to said second amplifier in a negative feedback configuration.

8. The pipelined DAC of claim 1, further comprising a second pipelined DAC operating in parallel with said pipelined DAC, wherein said pipelined DAC is coupled to said digital input and a sign of said digital input, wherein said second pipelined DAC is coupled to said digital input and an inverse of said sign of said digital input, and wherein an output of said second pipelined DAC is subtracted from an output of said first pipelined DAC.

9. The pipelined DAC of defined in claim 8, wherein a difference resulting from said subtraction is input to a sample and hold circuit.

10. A pipelined digital-to-analog converter (DAC) for converting a digital input to an analog output, said pipelined DAC comprising:
    a first plurality of stages, coupled to said digital input and a sign of said digital input, wherein a reference voltage to said first plurality of stages is positive if said digital input is positive and negative if said digital input is negative, wherein a first of said first plurality of stages is coupled to an initialization capacitor and ground, and wherein each of a remainder of said first plurality of stages is respectively coupled to a previous stage;
    a second plurality of stages, coupled to said digital input and an inverse of said sign of said digital input, wherein a reference voltage to said second plurality of stages is positive if said digital input is negative and negative if said digital input is positive, wherein a first of said second plurality of stages is coupled to an initialization capacitor and ground, and wherein each of a remainder of said second plurality of stages is respectively coupled to a previous stage; and
    a combiner for subtracting an output of said second plurality of stages from an output of said first plurality of stages, wherein each of said first and second plurality of stages includes:
        a capacitor having a first plate and a second plate, said capacitor receiving a charge at said first plate in accordance with an associated bit of said digital input;
        a first switch that selectively couples said first plate of said capacitor to ground when said capacitor is not receiving said charge; and
        a second switch that selectively couples said second plate of said capacitor to ground when said capacitor is receiving said charge,
        wherein coupling said capacitor to ground reduces an effect of stray capacitance in said pipelined DAC.

* * * * *